(12) United States Patent
Hori et al.

(10) Patent No.: US 12,101,079 B2
(45) Date of Patent: Sep. 24, 2024

(54) METHOD OF PRODUCING A BONDED BODY OF PIEZOELECTRIC MATERIAL SUBSTRATE

(71) Applicant: NGK INSULATORS, LTD., Nagoya (JP)

(72) Inventors: Yuji Hori, Owariasahi (JP); Takahiro Yamadera, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 571 days.

(21) Appl. No.: 16/898,925

(22) Filed: Jun. 11, 2020

(65) Prior Publication Data
US 2020/0304095 A1    Sep. 24, 2020

Related U.S. Application Data

(63) Continuation of application No. PCT/JP2019/043392, filed on Nov. 6, 2019.

(30) Foreign Application Priority Data

Nov. 9, 2018    (JP) .................. 2018-211338

(51) Int. Cl.
*H03H 9/02* (2006.01)
*H03H 3/08* (2006.01)
(Continued)

(52) U.S. Cl.
CPC .......... *H03H 9/02574* (2013.01); *H03H 3/08* (2013.01); *H03H 9/02559* (2013.01); *H03H 9/25* (2013.01); *H10N 30/072* (2023.02)

(58) Field of Classification Search
CPC ....... H01L 41/312; H01L 41/313; H03H 3/08; H03H 9/02559; H03H 9/02574; H03H 9/25
See application file for complete search history.

(56) References Cited

U.S. PATENT DOCUMENTS 10,284,169 B2 *   5/2019   Goto ................. H03H 9/02834
11,070,189 B2 *   7/2021   Goto ..................... H01L 41/313
(Continued)

FOREIGN PATENT DOCUMENTS

CN         102002673 A        4/2011
DE     112019001960 B4 *      7/2022     ......... C23C 14/0036
(Continued)

OTHER PUBLICATIONS

Notice of Reasons for Refusal (Japanese Office Action) with English translation issued in corresponding Japanese Application No. 2020-511833 dated Dec. 23, 2021 (4 pages).
(Continued)

*Primary Examiner* — Minh N Trinh
(74) *Attorney, Agent, or Firm* — FLYNN THIEL, P.C.

(57) ABSTRACT

A silicon film is provided on a supporting substrate composed of silicon by physical vapor deposition. The silicon film is subjected to heat treatment at a temperature of 400° C. or higher and 600° C. or lower to generate an intermediate layer. The piezoelectric material substrate is bonded to the supporting substrate through a bonding layer of silicon oxide and the intermediate layer. A method of providing an acoustic wave element with a bonded body is also provided.

10 Claims, 6 Drawing Sheets

(51) Int. Cl.
    *H03H 9/25*     (2006.01)
    *H10N 30/072*     (2023.01)

(56) References Cited

U.S. PATENT DOCUMENTS

| | | |
|---|---|---|
| 2015/0338731 A1 | 11/2015 | Nozawa et al. |
| 2017/0033764 A1 | 2/2017 | Inoue et al. |
| 2017/0063332 A1 | 3/2017 | Gilbert et al. |
| 2018/0159498 A1 | 6/2018 | Castex et al. |
| 2019/0007022 A1 | 1/2019 | Goto et al. |
| 2019/0036009 A1 | 1/2019 | Tai et al. |
| 2019/0280666 A1 | 9/2019 | Akiyama et al. |
| 2019/0288661 A1 | 9/2019 | Akiyama et al. |
| 2020/0058842 A1 | 2/2020 | Akiyama et al. |
| 2020/0304095 A1* | 9/2020 | Hori .................. H03H 9/25 |

FOREIGN PATENT DOCUMENTS

| | | |
|---|---|---|
| JP | 2001260099 A | 9/2001 |
| JP | 2011061269 A | 3/2011 |
| JP | 201858738 A | 4/2018 |
| JP | 201861226 A | 4/2018 |
| JP | 2018125325 A | 8/2018 |
| WO | 2017163722 A1 | 9/2017 |
| WO | 2017167923 A1 | 10/2017 |
| WO | 2018016169 A1 | 1/2018 |
| WO | 2018088093 A1 | 5/2018 |
| WO | 2018180827 A1 | 10/2018 |

OTHER PUBLICATIONS

European Search Report issued in corresponding European Application No. 19882081.3, dated Dec. 15, 2020 (11 pages).
D. Grozdanić et al., Structural characterization of thin amorphous Si films, ScienceDirect, Thin Solid Films 515 (2007) 5620-5623 (4 pages).
Takeshi Abe et al., Low Strain Sputtered Polysilicon for Micromechanical Structures, IEEE, 1996, pp. 258-262 (5 pages).
Korean Office Action with English translation issued in corresponding Korean Application No. 10-2020-7014752 dated Nov. 9, 2021 (9 pages).
English Translation of the International Preliminary Report on Patentability, issued in corresponding International Application No. PCT/JP2019/043392 Date of Mailing May 20, 2021 (9 pages).
C. Roda Neve et al., Impact of Si Substrate resistivity on the non-linear behaviour of RF CPW transmission lines, Proceedings of the 3rd European Microwave Integrated Circuit Conference, Oct. 2008, pp. 36-39.
H.S. Gamble et al., Low-Loss CPW Lines on Surface Stabilized High-Resistivity Silicon, IEEE Microwave and Guided Wave Letters, vol. 9, No. 10, Oct. 1999, pp. 395-397.
Chao-Jung Chen et al., A Nanocrystalline Silicon Surface-Passivation Layer on an HR-Si Substrate for RFICs, IEEE Electron Device Letters, vol. 32, No. 3, Mar. 2011, pp. 369-371.
Tsutomu Takai et al., I.H.P.SAW Technology and its Application to Microacoustic Components (Invited), Proceedings of IUS 2017 (8 pages).
International Search Report with English Translation issued in corresponding International Application No. PCT/JP2019/043392 date of mailing Jan. 28, 2020 (5 pages).
Written Opinion of International Searching Authority issued in corresponding International Application No. PCT/JP2019/043392 dated Jan. 28, 2020 (4 pages).
Office Action of European Patent Office issued in corresponding European Patent Application No. 19 882 081.3 dated Mar. 31, 2023 (6 pages).
Chinese Office Action with English translation issued in corresponding Chinese Application No. 201980005268.5 dated Aug. 1, 2024 (13 pages).

* cited by examiner

METHOD OF PRODUCING A BONDED BODY OF PIEZOELECTRIC MATERIAL SUBSTRATE

CROSS-REFERENCE TO RELATED APPLICATIONS

This is a continuation of PCT/JP2019/043392, filed Nov. 6, 2019, which claims priority to Japanese Application No. 2018-211338, filed Nov. 9, 2018, the entire contents of which are incorporated herein by reference.

TECHNICAL FIELD

The present invention relates to a bonded body of a piezoelectric material substrate and supporting substrate, a method of producing the same and an acoustic wave device.

BACKGROUND ARTS

SOI substrates have been widely used for realizing improved rates and lower electric power consumption of a CMOS device. However, it is known that high frequency characteristics of the CMOS devices are deteriorated due to fixed charges of $SiO_2$ (Non-patent document 1). Specifically, even in the case when a high-resistance silicon is used as an underlying substrate, the effective resistivity may be lowered, an electric field may be leaked and parasitic capacitance may be generated.

For preventing these problems, an SOI substrate having a structure of a layer including many carrier trapping levels (so-called trap rich layer) introduced direct under the $SiO_2$ film has been proposed. Specifically, the trapping levels are formed by forming a polycrystalline silicon layer (Non-patent document 2). Further, it is reported that the sizes of the microcrystals of the polycrystalline silicon layer are made smaller to improve the level density and to improve the preventative effects (Non-patent document 2).

Further, a high-performance acoustic wave filter using an adhered substrate composed of a piezoelectric material substrate, an $SiO_2$ film and silicon substrate has been made (Non-patent document 4). However, according to an acoustic wave filter for applying a high-frequency signal, it is speculated that the performance deteriorates due to the fixed charges of the $SiO_2$ film as the CMOS device.

Thus, according to patent document 1, a structure of forming an amorphous Si film or polycrystalline Si film on the surface of the silicon substrate, as the method of the suppression, is disclosed.

PRIOR TECHNICAL DOCUMENTS

Non-Patent Documents

Non-Patent Document 1

"Impact of Si substrate resistivity on the non-linear behavior of RF CPW transmission lines" Proceedings of the 3rd European Microwave Integrated Circuits Conference, pages 36 to 39

Non-Patent Document 2

"Low-LOSS CPW Lines on surface Stabilized High-Resistivity Silicon" IEEE MICROWAVE AND GUIDED WAVE LETTERS, VOL. 9, NO. 10, pages 395 to 397, October 1999

Non-Patent Document 3

"A Nanocrystalline Silicon Surface-Passivation Layer on an HR-Si Substrate for RFICs" IEEE ELECTRON DEVICE LETTERS, VOL. 32, NO. 3, pages 369 to 371, March 2011

Non-Patent Document 4

"I. H. P. SAW Technology and its application to Microacoustic Compounds (Invited), Proceedings of IUS 2017

PATENT DOCUMENTS (Patent document 1) US 2017/0063332 A1

SUMMARY OF THE INVENTION

Object to be Solved by the Invention

An amorphous Si film or polycrystalline Si film is film-formed by CVD method at a temperature of 400 to 1000° C. Thus, a large stress remains in the film after the film-formation. According to adhered substrates composed of a piezoelectric material body, an $SiO_2$ film and a silicon substrate, the respective thermal expansion coefficients are considerably different from each other, so that the fracture of the bonded body occurs during a process accompanied with heating, which is problematic. It has further been proved that the problems or cracks or fracture becomes considerable in the case when stress is present in the film.

An object of the present invention is, in bonding a piezoelectric material substrate and silicon substrate through a bonding layer composed of silicon oxide, to prevent the fracture or cracks of the bonded body and, at the same time, to improve effective resistivity of the bonded body over a wide frequency range.

Solution for the Object

The present invention provides a method of producing a bonded body, the method comprising:
  a silicon film-forming step of forming a silicon film on a supporting substrate comprising silicon by physical vapor deposition method;
  a heat treatment step of subjecting the silicon film to heat treatment at a temperature of 400° C. or higher and 600° C. or lower to generate an intermediate layer; and
  a bonding step of bonding a piezoelectric material substrate to the supporting substrate through a bonding layer comprising silicon oxide and the intermediate layer.

The present invention further provides a bonded body comprising:
  a bonding substrate comprising silicon;
  a piezoelectric material substrate;
  an intermediate layer formed by heat treatment of a silicon layer at a temperature of 400° C. or higher and 600° C. or lower, the silicon layer being provided on the supporting substrate by physical vapor deposition; and
  a bonding layer provided between said intermediate layer and a piezoelectric material substrate, the bonding layer comprising silicon oxide.

The present invention further provides an acoustic wave device comprising:
the bonded body; and
an electrode provided on the piezoelectric material substrate.

Effects of the Invention

For a piezoelectric material substrate and a silicon substrate bonded through a bonding layer composed of silicon oxide, the inventors have tried to provide a silicon film on the supporting substrate of silicon by sputtering and to bond the silicon film onto the piezoelectric material substrate through the bonding layer composed of silicon oxide. As physical vapor deposition is a kind of a low temperature process, different from the case when the polycrystalline silicon film or amorphous silicon film is provided as the production method described in the prior art, it is thought that the residual stress in the silicon film is small resulting in the suppression of cracks or fracture of the bonded body.

As the silicon film is actually provided on the silicon substrate by physical vapor deposition and the silicon film is bonded to the piezoelectric material substrate through the bonding layer of silicon oxide, the fracture or cracks of the bonded body could be suppressed. It is, however, proved that there is still room for improvement of the frequency characteristics of the effective resistivity of the bonded body.

Thus, the inventors have tried to form a silicon film on a silicon substrate by physical vapor deposition and to subject the silicon film to heat treatment at a temperature of 400° C. or higher and 600° C. or lower. As the silicon film after the heat treatment is bonded with the piezoelectric material substrate through the bonding layer of silicon oxide, it was found that the fracture or cracks are hardly generated in the bonded body. Moreover, in this case, it was found that the effective resistivity is maintained at a high value over a wide temperature range, and the present invention is thus made.

Further, the present inventors observed the microstructures of the silicon films formed on the silicon substrate by physical vapor deposition method before and after the heat treatment. However, a clear difference in the microstructures before and after the heat treatment was not found. On the other hand, in the case where the silicon film is subjected to the heat treatment, the effective resistivity of the bonded body can be maintained at a high volume over a wide temperature range. It is thus clear that the microstructure of the silicon film or the microstructure along the interface of the silicon film and silicon substrate is changed. However, at present, the procedure of clarifying the change of the microstructure by a physical means is unclear, so that its clarification as a product is considered to be difficult and non-practical.

EMBODIMENTS FOR CARRYING OUT THE INVENTION

Figure 1A:
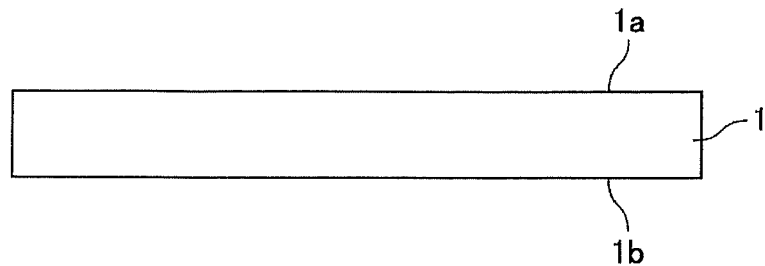
FIG. 1(a) shows a supporting substrate.

The present invention will be described further in detail, appropriately referring to the drawings.

Figure 1B:
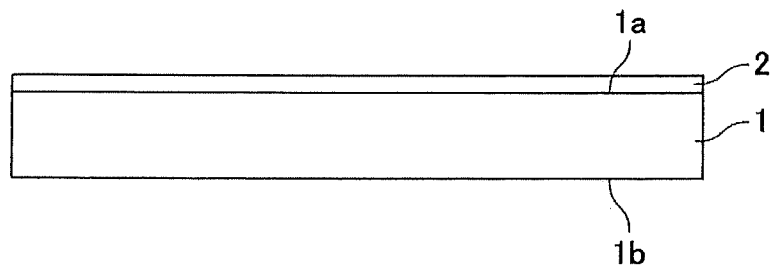
FIG. 1(b) shows the state that a silicon film is formed on the supporting substrate.
Figure 1C:
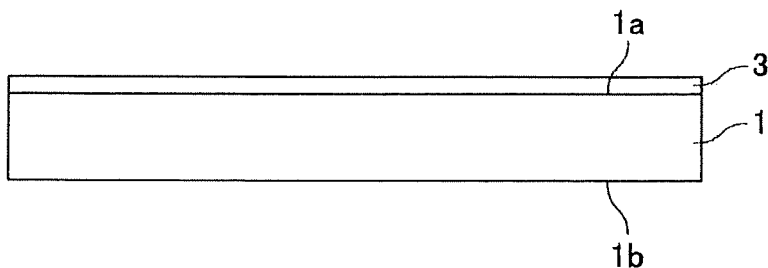
FIG. 1(c) shows the state that the silicon film is subjected to heat treatment to form an intermediate layer.
Figure 1D:
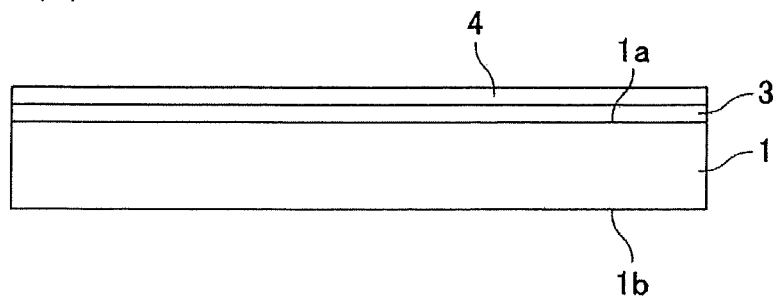
FIG. 1(d) shows the state that a first silicon oxide layer is provided on the intermediate layer.

As shown in FIG. 1(a), a supporting substrate 1 having a pair of main faces 1a and 1b is prepared. The supporting substrate 1 is composed of silicon. Then, as shown in FIG. 1(b), a silicon film 2 is film-formed on the main face 1a of the supporting substrate 1 by physical vapor deposition. Then, the silicon film 2 and supporting substrate 1 are subjected to heat treatment at a temperature of 400° C. or higher and 600° C. or lower, to provide an intermediate layer 3 composed of silicon (FIG. 1(c)). Then, a first silicon oxide layer 4 may be provided on the intermediate layer 3 (FIG. 1(d)).

Figure 2A:
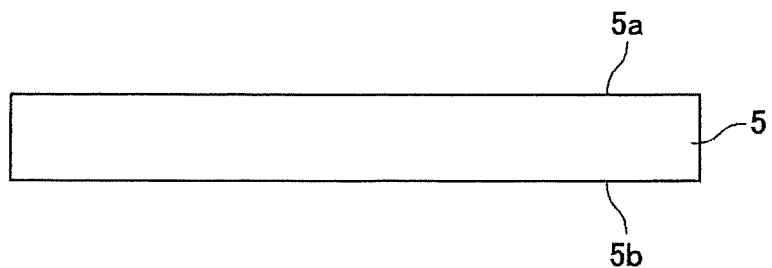
FIG. 2(a) shows a piezoelectric material substrate.
Figure 2B:
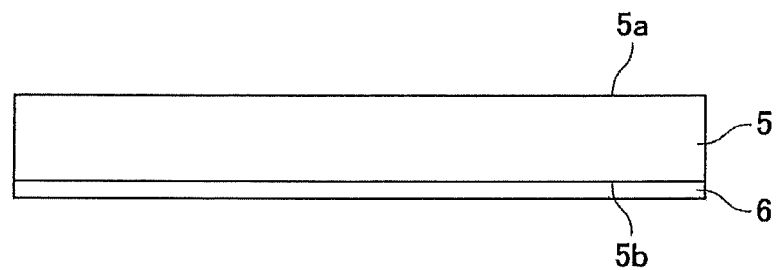
FIG. 2(b) shows the state that a second silicon oxide layer is provided on the piezoelectric material substrate.

Further, as shown in FIG. 2(a), a piezoelectric material substrate 5 having a pair of main faces 5a and 5b is prepared. Then, as shown in FIG. 2(b), a second silicon oxide layer 6 composed of silicon oxide is provided on the main face 5b of the piezoelectric material substrate 5.

According to a preferred embodiment, plasma is irradiated onto surfaces of the first silicon oxide layer 4 and second silicon oxide layer 6 to perform the surface activation to form activated bonding surfaces.

Figure 3A:
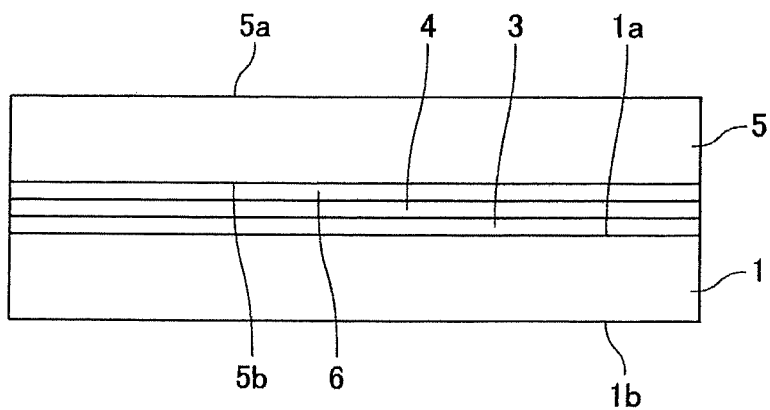
FIG. 3(a) shows the state that the first silicon oxide layer and second silicon oxide layer are contacted with each other.
Figure 3B:
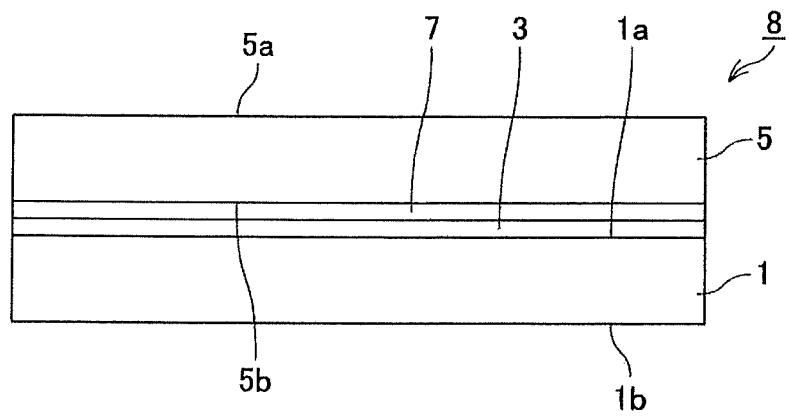
FIG. 3(b) shows a bonded body.

Then, as shown in FIG. 3(a), the activated surface of the first silicon oxide layer 4 on the supporting substrate 1 and the activated surface of the second silicon oxide layer 6 on the piezoelectric material substrate 5 are contacted and directly bonded with each other. It is thus possible to obtain a bonded body 8 as shown in FIG. 3(b). At the bonding stage, the first silicon oxide layer 4 and second silicon oxide layer 6 are usually integrated to form an integrated bonding layer 7.

Figure 4A:
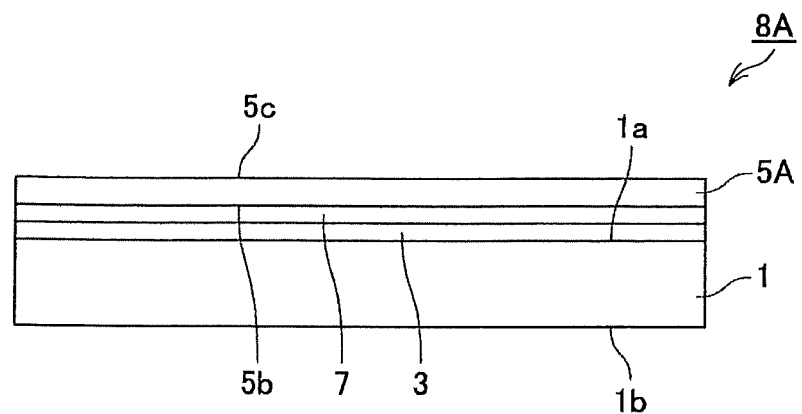
FIG. 4(a) shows the state that a piezoelectric material substrate of a bonded body is thinned.
Figure 4B:
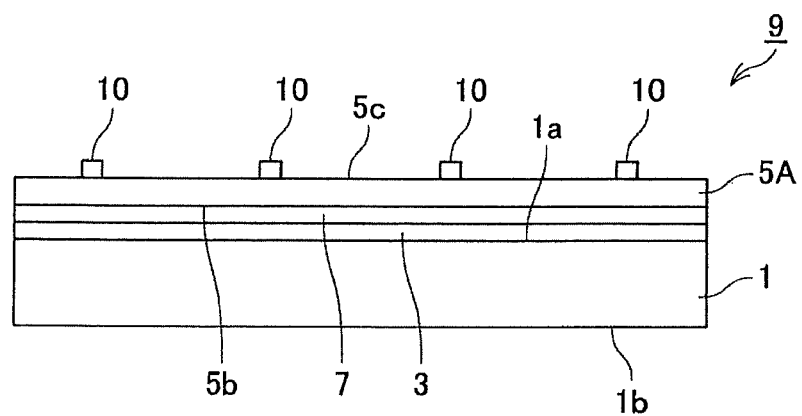
FIG. 4(b) shows an acoustic wave device.

At this stage, an electrode may be provided on the piezoelectric material substrate 5. However, preferably, as shown in FIG. 4(a), a main face 5a of the piezoelectric material substrate 5 is processed to thin the substrate 5, to obtain a thinned piezoelectric material substrate 5A. 5c represents a processed surface. Then, as shown in FIG. 4(b), predetermined electrodes 10 may be formed on a processed surface 5c of the piezoelectric material substrate 5A of the bonded body 8A to obtain an acoustic wave device 9.

The respective constituents of the present invention will be described further in detail below.

According to the method of the present invention, the silicon film is provided on a supporting substrate of silicon by a physical vapor deposition method.

Although the kind of silicon forming the supporting substrate is not particularly limited, silicon single crystal is preferred, and phosphorus or boron may be doped into silicon. Further, silicon forming the supporting substrate may preferably be a high-resistance silicon having a volume resistivity of 1000 Ω·cm or higher.

The silicon film is film-formed on the supporting substrate by a physical vapor deposition method. At this time, the physical vapor deposition is preferably performed at a temperature of 200° C. or lower, more preferably performed at a temperature of 150° C. or lower, and particularly preferably performed at a temperature of 100° C. or lower.

The physical vapor deposition method includes sputtering and vapor deposition. The sputtering method is preferably a reactive sputtering method due to the stability of film quality and film-forming rate. Specifically, a target of Si metal is sputtered with Art ions and then subjected to reaction with oxygen plasma to form a silicon oxide film. Further, as the vapor deposition method, an ion beam-assisted vapor deposition method is preferred for improving film density and surface smoothness. According to each of the film-forming methods, the temperature elevation during the film-formation can be suppressed at 150° C. or lower.

Then, according to the present invention, the silicon film is subjected to heat treatment at a temperature of 400° C. or higher and 600° C. or lower to generate an intermediate layer. It is thus possible to prevent cracks and fracturing of the bonded body and, at the same time, to improve the effective resistivity of the bonded body over a wide frequency range.

The thickness of the intermediate layer is preferably 50 nm or larger and more preferably 100 nm or larger. Further, the thickness of the intermediate layer is preferably 2 μm or smaller and more preferably 1 μm or smaller. The time duration of the heat treatment is preferably 2 to 10 hours, and the atmosphere during the heat treatment is preferably inert gas atmosphere such as nitrogen or argon or vacuum environment.

The piezoelectric material substrate is then bonded with the supporting substrate through the bonding layer of silicon oxide and intermediate layer. In this case, the silicon oxide layer may be provided on the intermediate layer, and the silicon oxide layer may be directly bonded with the piezoelectric material substrate. Alternatively, the first silicon oxide layer may be provided on the intermediate layer on the supporting substrate, the second silicon oxide layer may be provided on the piezoelectric material substrate, and the first silicon oxide layer and second silicon oxide layer may be directly bonded with each other to generate the bonding layer.

When the silicon oxide layer is formed on the intermediate layer or piezoelectric material substrate, although the film-formation method of the silicon oxide layer is not limited, sputtering, chemical vapor deposition (CVD) and vapor deposition may be employed. When the silicon oxide layer is formed on the intermediate layer, the silicon oxide layer can be formed by sputtering or ion injection of oxygen into the intermediate layer, or by heating under oxidizing atmosphere.

The thickness of the bonding layer composed of silicon oxide is preferably 0.05 μm or larger, more preferably 0.1 μm or larger and particularly preferably 0.2 μm or larger. Further, the thickness of the bonding layer is preferably 3 μm or smaller, more preferably 2.5 μm or smaller and further preferably 2.0 μm or smaller.

The piezoelectric material substrate is made of single crystals of lithium tantalate (LT), lithium niobate (LN) or a lithium niobate-lithium tantalate solid solution. As the materials have high propagation speeds of a surface acoustic wave and large electro-mechanical coupling factors, the substrate is preferred for use in a piezoelectric surface wave device for high frequency and wide-band frequency applications.

Further, the normal directions of the main surface 5a and 5b of the piezoelectric material substrate 5 are not particularly limited. For example, in the case that the piezoelectric material substrate is made of lithium nitride, it is preferred to use the substrate rotated from Y-axis toward Z-axis by 32 to 55° (180°, 58° to 35°, 180° on Eulerian angle representation) around X-axis, which is a direction of propagation of a surface acoustic wave, because of a low propagation loss. In the case that the piezoelectric material substrate is made of lithium niobate, (i) it is preferred to use the substrate rotated from Z-axis toward −Y-axis by 37.8° (0°, 37.8°, 0° on Eulerian angle representation) around X-axis, which is a direction of propagation of a surface acoustic wave, because of a large electro-mechanical coupling factor. Alternatively, (ii) it is preferred to use the substrate rotated from Y-axis toward Z-axis by 40 to 65° (180°, 50 to 25°, 180° on Eulerian angle representation) around X-axis, which is a direction of propagation of a surface acoustic wave, because a high acoustic speed can be obtained. Further, although the size of the piezoelectric material substrate is not particularly limited, for example, the diameter may be 100 to 200 mm and the thickness may be 0.15 to 1 μm.

Oxygen plasma is preferably irradiated onto the piezoelectric material substrate and the respective silicon oxide layers at a temperature of 150° C. or lower to activate the respective surfaces, before the surface of the piezoelectric material substrate and the silicon oxide layer on the intermediate layer are directly bonded with each other, or before the first silicon oxide layer and second silicon oxide layer are directly bonded with each other.

The pressure during the surface activation is preferably 100 Pa or lower and more preferably 80 Pa or lower. Further, the atmosphere may be composed of oxygen only, or nitrogen gas in addition to oxygen.

The temperature during the irradiation of the oxygen plasma is 150° C. or lower. It is thereby possible to obtain the bonded body having a high bonding strength without deterioration of the piezoelectric material. The temperature during the oxygen plasma irradiation is preferably 150° C. or lower and is more preferably 100° C. or lower.

The energy of the oxygen plasma irradiated onto the surface of the piezoelectric material substrate is preferably 100 to 150 W. Further, the product of the energy and time duration of irradiation during the irradiation of the oxygen plasma is preferably 20 to 50 Wh. Further, the time duration of irradiation of the oxygen plasma is preferably 30 minutes or longer.

Further, the pressure during the plasma irradiation onto the surface of the silicon oxide layer is preferably 100 Pa or lower and more preferably 80 Pa or lower. The energy at this time is preferably 30 to 120 W. Further, the product of the energy of the plasma irradiation and irradiation time duration is preferably 1 Wh or lower.

According to a preferred embodiment, the surface of the piezoelectric material substrate and surfaces of the respective silicon oxide layers are subjected to a flattening process before the plasma treatment. The method of flattening the respective surfaces includes lapping, chemical mechanical polishing (CMP) and the like. Further, the arithmetic surface roughness Ra of the flattened surface is preferably 1.0 nm or lower and more preferably 0.3 nm or lower.

The first silicon oxide layer and second silicon oxide layer may be then contacted with each other, or the silicon oxide layer and piezoelectric material substrate are then contacted with each other to perform the direct bonding. Thereafter, it is preferred to perform an annealing treatment to improve the bonding strength. The temperature during the annealing treatment is preferably 100° C. or higher and 300° C. or lower.

The bonded body of the present invention is preferably applied as an acoustic wave device.

As the acoustic wave device, a surface acoustic wave device, Lamb wave-type device, thin film resonator (FBAR) or the like is known. For example, the surface acoustic wave device is produced by providing an input side IDT (Inter-digital transducer) electrode (also referred to as comb electrodes or interdigitated electrodes) for an oscillating surface acoustic wave and an IDT electrode on the output side for receiving the surface acoustic wave, on the surface of the piezoelectric single crystal substrate. By applying a high frequency signal on the IDT electrode on the input side, an electric field is generated between the electrodes, so that the surface acoustic wave is oscillated and propagated on the piezoelectric substrate. Then, the propagated surface acoustic wave is drawn as an electrical signal from the IDT electrode on the output side provided in the direction of the propagation.

A material forming the electrodes (electrode pattern) of the piezoelectric material substrate is preferably aluminum, an aluminum alloy, copper or gold, and more preferably aluminum or aluminum alloy. The aluminum alloy is preferably Al with 0.3 to 5 weight % of Cu mixed therein. In this case, Ti, Mg, Ni, Mo or Ta may be used instead of Cu.

EXAMPLES

Inventive Example 1

A bonded body according to an embodiment of the present invention, as described referring to FIGS. 1 to 4, was obtained.

Specifically, an Si substrate (supporting substrate) 1 of a high resistance (≥2 kΩ·cm), a thickness of 0.23 mm and a diameter of 150 mm was prepared. The supporting substrate 1 was introduced into a sputtering system "RAS-1100BII" supplied by SYNCHRON Co. Ltd. to form a silicon film 2 having a thickness of about 500 nm. The film-forming conditions are as follows.
Bias voltage: 6000 W
Ar gas flow rate: 100 sccm
Electric power of microwave: 1500 W
Rate: 0.3 nm/sec
Pressure in chamber during film-formation: 0.1 Pa The supporting substrate 1 with the silicon film 2 formed thereon was drawn out of the chamber and then subjected to heat treatment in a clean oven at 500° C. for 10 hours to generate an intermediate layer 3. The atmosphere during the heat treatment was nitrogen atmosphere and the pressure of the atmosphere was 1 atm.

The supporting substrate 1 after the heat treatment was then introduced into the sputtering system again and a first silicon oxide layer 4 composed of $SiO_2$ was film-formed at a thickness of 600 nm. At the same time, in the same chamber a piezoelectric material substrate 5 having a thickness of 0.25 mm, with both surfaces being mirror surfaces and composed of 42° Y-cut black lithium tantalate substrate, was introduced to form a second silicon oxide film 6. The film-forming conditions were as follows. Besides, when silicon is film-formed by sputtering, O2 gas was introduced at a flow rate of 200 sccm for oxidizing silicon.
Bias voltage: 6000 W
Ar gas flow rate: 100 sccm
Electric power of microwave: 1500 W
Rate: 0.3 nm/sec
Pressure inside of chamber during film-formation: 0.1 Pa The supporting substrate 1 and piezoelectric material substrate 5 after the film-formation were drawn out of the chamber, and the first silicon oxide layer 4 and second silicon oxide layer 6 were subjected to CMP (chemical mechanical polishing) at a thickness of about 100 nm. Thereafter, the Ra of each of the surfaces was about 0.2 nm, indicating that very smooth surfaces were obtained.

The respective surfaces of the first silicon oxide layer 4 and second silicon oxide layer 6 were then cleaned to remove particles from the respective surfaces. The thus cleaned first and second silicon oxide layers were contacted with each other as shown in FIG. 3(a) to perform plasma activation bonding. For obtaining a sufficiently high bonding strength, the bonded body was held in an oven at 120° C. for 10 hours. The piezoelectric material substrate of the bonded body 8 drawn out of the oven was subjected to grinding and polishing so that the thickness finally reached 1 μm.

Figure 5A:
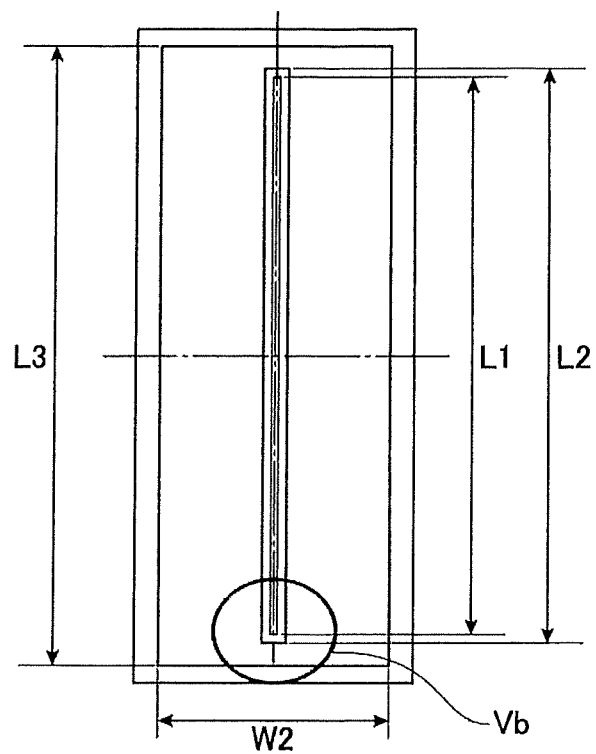
FIG. 5(a) shows a CPW-type electrode used in the Examples section.
Figure 5B:
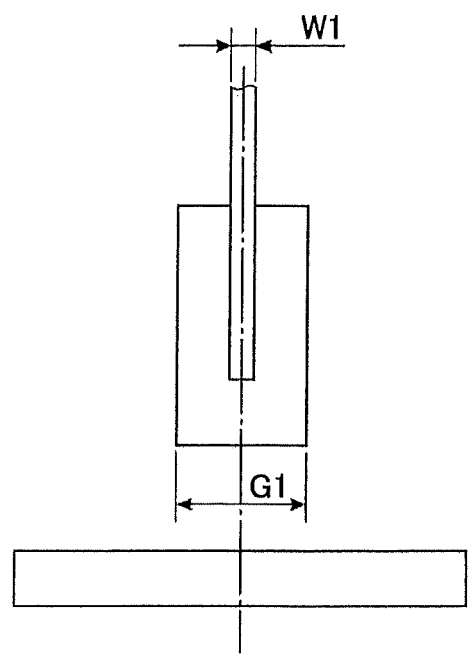
FIG. 5(b) shows an enlarged view of Vb part of FIG. 5(a).
Figure 6:
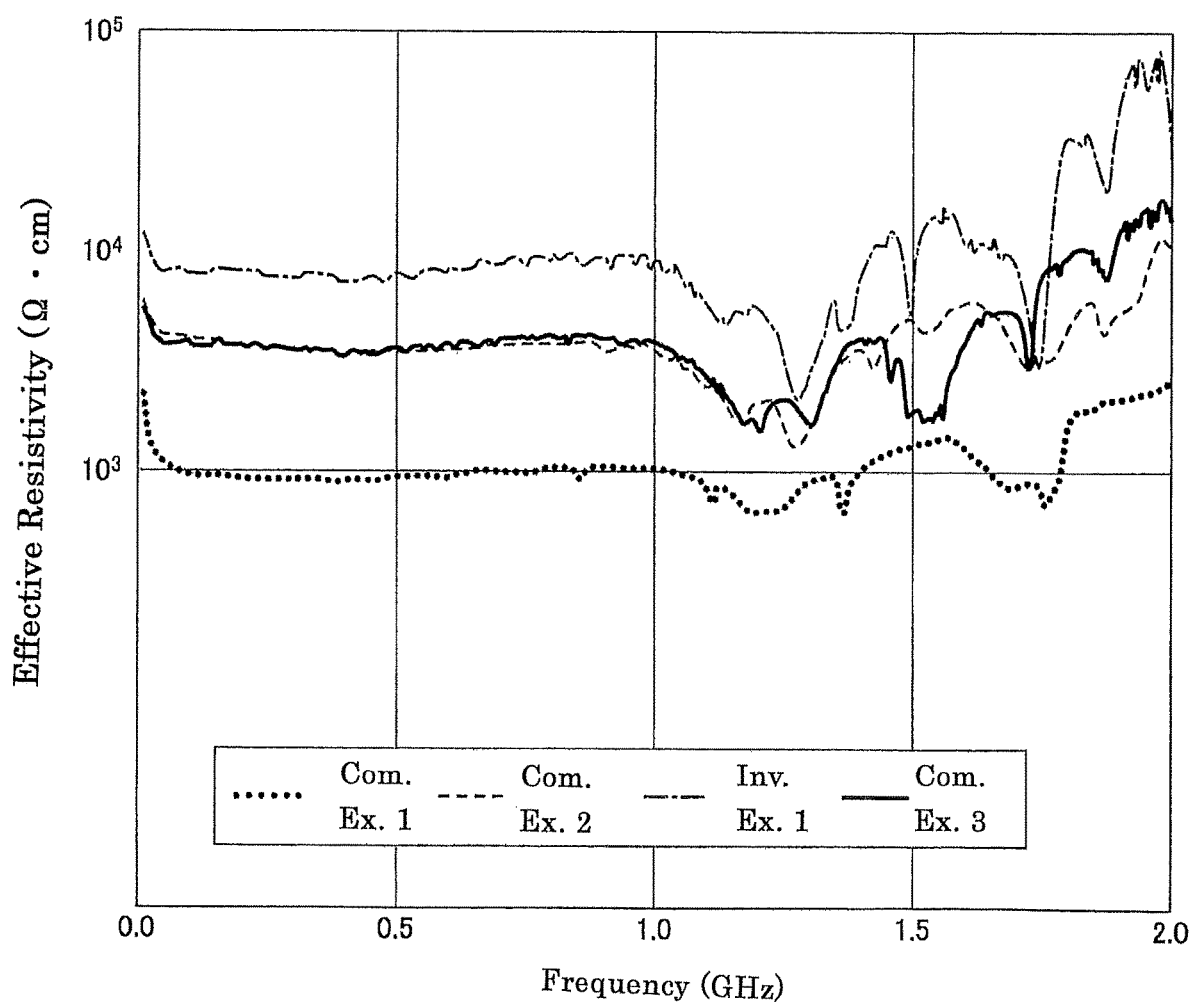
FIG. 6 shows a graph showing change of frequency of effective resistivity in devices according to the inventive and comparative examples.

For evaluating the high-frequency characteristics of the thus produced bonded body 8A, a coplanar type waveguide (CPW) as shown in FIGS. 5(a) and 5(b) was produced on the piezoelectric material substrate. Further, FIG. 5(a) shows a planar pattern of CPW, and FIG. 5(b) shows a shape of an end part of the CPW shown in FIG. 5(a). Further, the design specifications of the CPW are shown below.
L1: 2100 μm
L2: 2500 μm
L3: 3100 μm
W1: 60 μm
W2: 3000 μm
G1: 340 μm High frequency probes (TP40-GSG-250-N-L) supplied by Techno Probe Co. Ltd. were contacted to both end parts of the CPW, and the S parameter of the CPW was measured by a network analyzer "PNA-X" supplied by KEYSIGHT TECHNOLOGIES. The effective resistivity of the bonded body was calculated based on the Shunt-Through method, from the thus measured data. FIG. 6 shows the change of the effective resistivity on frequency (Inventive Example 1).

Comparative Example 1

According to the present example, the silicon oxide layer 4 was formed on the supporting substrate, without forming the intermediate layer 3 functioning as a trap-rich layer. The other processes were the same as those of Inventive Example 1 to obtain a bonded body. The change of the effective resistivity on frequency of the bonded body was measured according to the same procedure as Inventive Example 1, and the results are shown in FIG. 6.

As a result, according to Inventive Example 1, the effective resistivity was considerably higher than that of Comparative Example 1 without the trap-rich layer over the whole frequency range. For example, at 1 GHz, the effective resistivity of Comparative Example 1 was $1 \times 10^4$ Ω·cm and that of Inventive Example 1 was $3 \times 10^4$ Ω·cm, and the effective resistivity of the latter was higher by three times. That is, according to Inventive Example 1, it was confirmed that the characteristics in a high frequency range were particularly improved.

Comparative Example 2

According to the present example, a bonded body was produced according to the same processes as those for Inventive Example 1, except that the heat treatment of the silicon film 2 formed by sputtering was not performed. The change of the effective resistivity on frequency of the bonded body was measured according to the same procedure as for Inventive Example 1, and the results are shown in FIG. 6.

As a result, according to Inventive Example 1, the effective resistivity was considerably improved with respect to that of Comparative Example 2 over the whole frequency range. For example, at 1 GHz, the effective resistivity of Comparative Example 2 was $2\times10^4$ Ω·cm and the effective resistivity of Inventive Example 1 was $3\times10^4$ Ω·cm, and that of the latter was higher by 1.5 times. This means that the properties of the silicon layer film-formed on the silicon substrate by sputtering were changed by the heat treatment to improve the effective resistivity.

Comparative Example 3

A bonded body according to the same procedure as Inventive Example 1 was produced. However, the silicon film 2 was not formed by sputtering on the supporting substrate. Instead, polycrystalline silicon was film-formed on the supporting substrate by LP-CVD method at 700° C. in a thickness of 500 nm. The change of the effective resistivity on frequency of the bonded body was measured according to the same procedure as for Inventive Example 1, and the results are shown in FIG. 6.

As a result, the change of the effective resistivity on frequency was substantially comparable with that of Comparative Example 2.

(Heat Resistance Test)

The respective bonded bodies according to Inventive Example 1 and Comparative Examples 1, 2 and 3 were placed into a clean oven at a temperature of 250° C., and the respective bonded bodies were drawn out after 20 hours. As a result, cracks or fractures were not observed and the effect of suppressing the residual stress due to low-temperature film formation was confirmed, according to the bonded bodies of Inventive Example 1 and Comparative Examples 1 and 2. Contrary to this, the bonded body of Comparative Example 3 was broken into two pieces.

The invention claimed is:

1. A method of producing an acoustic wave element comprising the steps of:
    providing a piezoelectric material substrate and a supporting substrate;
    forming a silicon film on said supporting substrate by physical vapor deposition of silicon at a temperature of 100° C. or lower;
    after the forming of the silicon film on the supporting substrate, subjecting said silicon film to heat treatment at a temperature between 400° C. and 600° C. to generate an intermediate layer, the intermediate layer being a trap-rich layer comprising a plurality of carrier trapping levels;
    bonding said piezoelectric material substrate to said supporting substrate by a bonding layer, said bonding layer comprising silicon oxide and said intermediate layer after said heat treatment; and
    providing an electrode on said piezoelectric material substrate to obtain the acoustic wave element after the bonding of said piezoelectric material substrate to said supporting substrate.

2. The method of claim 1, wherein the bonding of said piezoelectric material substrate to said supporting substrate further comprises:
    forming a first silicon oxide layer on said intermediate layer;
    forming a second silicon oxide layer on said piezoelectric material substate; and
    directly bonding said first silicon oxide layer and said second silicon oxide layer to generate said bonding layer.

3. The method of claim 1, wherein said piezoelectric material substrate comprises a material selected from the group consisting of lithium niobate, lithium tantalate and lithium niobate-lithium tantalate.

4. The method of claim 1, further comprising reducing thickness of said piezoelectric material substrate by polishing after the bonding of said piezoelectric material substrate to said supporting substrate.

5. The method of claim 1, wherein the thickness of the intermediate layer is 2 μm or less.

6. A method of producing an acoustic wave element comprising the steps of:
    providing a piezoelectric material substrate and a supporting substrate;
    forming a silicon film on said supporting substrate by physical vapor deposition of silicon at a temperature of 100° C. or lower, the formed silicon film having a volume resistivity of 1000 Ω·cm or higher;
    after forming the silicon film on said supporting substrate, subjecting said silicon film to a heat treatment at a temperature between 400° C. and 600° C. to form an intermediate layer, the formed intermediate layer configured to function as a trap-rich layer including a plurality of carrier trapping levels;
    bonding said piezoelectric material substrate to said supporting substrate by a bonding layer, said bonding layer comprising silicon oxide and said intermediate layer after subjecting the silicon film to said heat treatment; and
    providing an electrode on said piezoelectric material substrate to obtain the acoustic wave element after the bonding of said piezoelectric material substrate to said supporting substrate.

7. The method of claim 6, wherein the bonding of said piezoelectric material substrate to said supporting substrate step further comprises:
    forming a first silicon oxide layer on said intermediate layer;
    forming a second silicon oxide layer on said piezoelectric material substate; and
    directly bonding said first silicon oxide layer and said second silicon oxide layer to generate said bonding layer.

8. The method of claim 6, wherein said piezoelectric material substrate comprises a material selected from the group consisting of lithium niobate, lithium tantalate and lithium niobate-lithium tantalate.

9. The method of claim 6, further comprising reducing thickness of said piezoelectric material substrate by polishing after the bonding of said piezoelectric material substrate to said supporting substrate.

10. The method of claim 6, wherein the thickness of the intermediate layer is 2 μm or less.

* * * * *